(12) United States Patent
Nakao

(10) Patent No.: US 6,509,621 B2
(45) Date of Patent: Jan. 21, 2003

(54) MAGNETIC RANDOM ACCESS MEMORY CAPABLE OF WRITING INFORMATION WITH REDUCED ELECTRIC CURRENT

(75) Inventor: Hiroshi Nakao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/749,464

(22) Filed: Dec. 28, 2000

(65) Prior Publication Data

US 2001/0025978 A1 Oct. 4, 2001

(30) Foreign Application Priority Data

Mar. 3, 2000 (JP) ........................................ 2000-058098

(51) Int. Cl.$^7$ ........................... H01L 43/00; G11C 11/14
(52) U.S. Cl. ........................................ 257/421; 365/171
(58) Field of Search ............................... 257/421, 424, 257/427; 365/171, 173

(56) References Cited

U.S. PATENT DOCUMENTS 5,801,984 A * 9/1998 Parkin ........................ 365/158
6,034,887 A * 3/2000 Gupta et al. ................. 365/171
6,169,686 B1 * 1/2001 Brug et al. ................... 365/171
6,312,840 B1 * 11/2001 Kumagai et al. ............. 428/692

FOREIGN PATENT DOCUMENTS

EP 0 759 619 A2 * 9/1997 ........... G11C/11/14

OTHER PUBLICATIONS

Meservey et al., Physics Reports, 1994, vol. 238, pp. 200–214.*

* cited by examiner

Primary Examiner—Allan R. Wilson
(74) Attorney, Agent, or Firm—Armstrong, Westerman & Hattori, LLP

(57) ABSTRACT

A magnetic random access memory includes a ferromagnetic pinned layer having a spin polarization of 0.9 or more in a TMR sensor constituting a memory cell. Further, the construction for reducing a write current by applying an offset magnetic field to the memory cell, is also disclosed.

15 Claims, 14 Drawing Sheets

40 Oe

Iwx=Iwy=1mA
(δHx=δHy=20 Oe)

Iwx=Iwy=0mA

Iwx=-1mA, Iwy=1mA

Iwx=1mA, Iwy=0mA

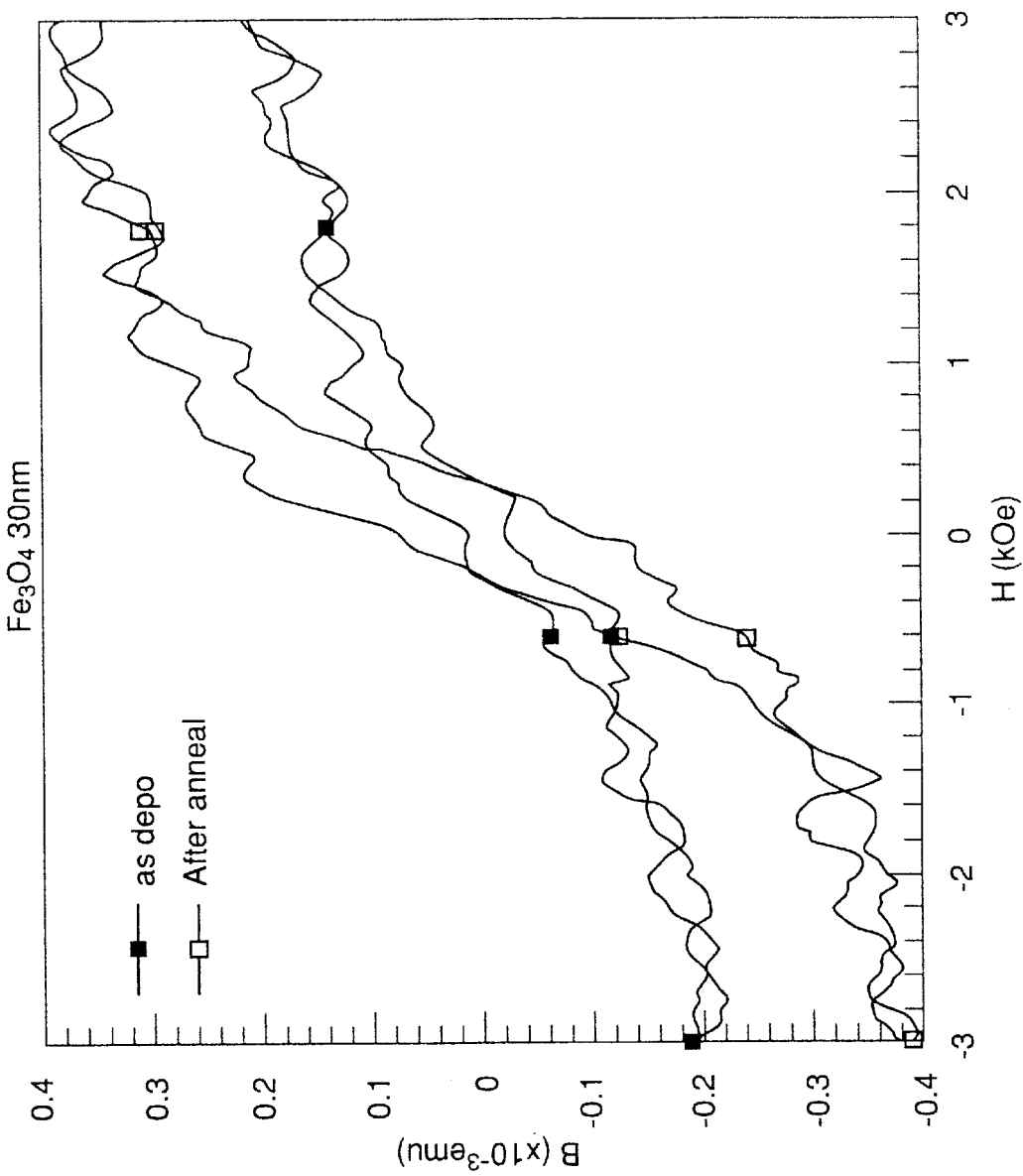

MAGNETIC RANDOM ACCESS MEMORY CAPABLE OF WRITING INFORMATION WITH REDUCED ELECTRIC CURRENT

CROSS-REFERENCE TO RELATED APPLICATION

The present application is based on Japanese priority application No. 2000-58098 filed on Mar. 3, 2000, the entire contents of which are hereby incorporated by reference.

BACKGROUND OF THE INVENTION

The present invention generally relates to magnetic memory devices and more particularly to a magnetic random access memory capable of writing information with a reduced write-current.

A magnetic random access memory (MRAM) is a magnetic memory device that stores information in the form of magnetization in a ferromagnetic layer constituting a part of a magneto-resistive sensor. The information thus written into the ferromagnetic layer is read out by detecting a magneto-resistance of the magneto-resistive sensor.

A MRAM is characterized by high operational speed comparable to that of a static random access memory (SRAM) and a simple construction suitable of forming a high-density integrated circuit. In addition, a MRAM has an advantageous feature of immunity to soft-errors caused by penetration of charged particles such as cosmic ray.

With the progress in the art of GMR (giant magneto-resistive) sensors, particularly with the progress of a TMR (tunneling magneto-resistive) sensor, application of MRAM is expanding rapidly in various fields of electronics including computers and telecommunication.

FIGS. 1A–1C are diagrams showing the principle of a MRAM according to a related art (S. S. P. Parkin, et al., J. Appl. Phys. vol.85, pp.5828, 1999).

Referring to FIG. 1A showing a single MRAM cell, the MRAM cell includes a word line 56 extending in a first direction and a bit line 57 extending in a second, different direction, and a TMR sensor is interposed between the word line 56 and the bit line 57 in correspondence to an intersection part where the word line 56 and the bit line 57 cross with each other.

More specifically, the TMR sensor includes a ferromagnetic free layer 52 provided on the word line 56 via an intervening foundation layer 51, and a tunneling barrier layer 53 of $AlO_x$ and a ferromagnetic pinned layer 54 are formed consecutively on the foregoing ferromagnetic free layer 52. Further, there is provided an anti-ferromagnetic pinning layer 55 between the ferromagnetic pinned layer 54 and the bit line 57, wherein the anti-ferromagnetic pinning layer 55 causes a pinning of magnetization in the pinned layer 54 in a predetermined direction represented in an arrow.

When writing information, a word line current is caused to flow through the word line 56 in the direction represented by an arrow in FIG. 1B together with a bit line current, which is caused to flow through the bit line 57 in the direction represented by another arrow in FIG. 1B. Thereby, the bit line current and the word line current induce respective magnetic fields 57 and 58 as represented in FIG. 1B, and a synthetic magnetic is field formed as a result of a sum of the magnetic fields 57 and 58. The synthetic magnetic field thus formed induces a magnetization in the ferromagnetic free layer 25 as represented by an arrow in FIG. 1B. In the state of FIG. 1B, it can be seen that the magnetization in the free layer 52 and the magnetization in the pinned layer 53 are in an anti-parallel relationship. The state of FIG. 1B represents a data bit "0."

Alternatively, the ferromagnetic free layer 52 may be magnetized in a parallel relationship as represented in FIG. 1C. The state of FIG. 1C may be designated as a data bit "1." The information thus written into the MRAM cell is held stably even when the electric power to the MRAM cell is turned off. In other words, MRAMs function as a non-volatile memory.

In the state of FIG. 1B, there is formed a large magneto-resistance between the ferromagnetic free layer 52 and the ferromagnetic pinned layer 54 in correspondence to the anti-parallel relationship of the magnetization in the layers 52 and 54, while in the state of FIG. 1C, there is formed a small magneto-resistance in correspondence to the parallel relationship of the magnetization. Thus, reading of information can be achieved by detecting a magneto-resistance of the TMR sensor formed between the word line 56 and the bit line 57. Such reading of information is non-destructive reading.

In a TMR sensor, it should be noted that a ratio of tunneling resistance change or TMR ratio $\Delta R$ is defined as $$\Delta R = 2 P_1 \times P_2/(1 - P_1 \times P_2) \qquad \text{Eq.(1)}$$

wherein $P_1$ represents a spin polarization of the pinned layer 54 while $P_2$ represents a spin polarization of the free layer 52.

Thus, a TMR ratio $\Delta R$ of about 50% is achieved when a NiFe alloy, having a spin polarization of about 45%, is used for the free layer 52 and also for the pinned layer 54:

$$\Delta R_{max} = 2 \times 0.45 \times 0.45 (1 - 0.45 \times 0.45)$$
$$= 0.405/0.7975 \approx 0.508.$$

When writing information into the magnetic random access memory of FIG. 1A, it is necessary to apply an external magnetic field ($H_x$, $H_y$) such that the external magnetic field exceeds a critical value given by a relationship of $$(H_x/H_{x0})^{2/3} + (H_y/H_{y0})^{2/3} = 1 \qquad \text{Eq.(2)}$$

wherein $H_{x0}$ represents a coercive force in the direction of easy axis of magnetization while $H_{y0}$ represents a coercive force in the direction of hard axis of magnetization.

FIG. 2 shows an asteroid curve corresponding to the relationship of Eq.(2) above, wherein there occurs an inversion or reversal of magnetization in the free layer 52 when the external magnetic field ($H_x$, $H_y$), caused by the magnetic fields 57 and 58, has exceeded the closed region defined by the asteroid curve.

From FIG. 2, it will be understood that the word line current and the bit line current for creating the inverting magnetic field ($H_x$, $H_y$) should have the same magnitude in order to minimize the magnitude of the word line current and further the bit line current.

On the other hand, such a MRAM has a problem in that the magnitude of the external magnetic field needed for inverting the magnetization of the magnetic free layer 52 increases with increasing degree of device miniaturization. It should be noted that the relative ratio of the thickness of the ferromagnetic free layer 52 to the lateral size thereof, and hence the structural anisotropy of the ferromagnetic free layer 52 in which the information is stored, increases with increasing degree of device miniaturization.

In the case a ferromagnetic free layer 52 is formed of a NiFe alloy, the external magnetic field needed for causing an inversion of magnetization in the free layer 52 reaches as much as 50–100 Oe when the MRAM is formed according to the 0.1 μm design rule, in which the bit lines 57 are formed with a 0.1 μm line-and-space pitch. In order to create the foregoing magnetic field by the electric current flowing through the bit line 57 and the word line 52, a current density of as much as $3-5 \times 10^7 A/cm^2$ is needed, provided that the word line 52 and the bit line 57 are offset from a thickness center of the MRAM cell by a distance of 0.1 μm. With such a large electric current density, even a Cu conductor pattern, which is thought immune to electro-migration up to the current density of $10^6 A/cm^2$, would cause electro-migration. This means that miniaturization beyond the 0.1 μm design rule is not possible in the MRAM of FIG. 1A.

Of course, the word line current and the bit line current needed in a MRAM for writing information can be reduced by adding impurity elements to the ferromagnetic free layer 52 such that the coercive force thereof is reduced or the saturation magnetization is reduced. However, such an approach is thought undesirable as it would degrade the performance of the magnetic material and hence the TMR ratio ΔR of the TMR sensor and the S/N ratio of the MRAM.

Generally, the TMR ratio ΔR of a TMR sensor can be increased when the value of the spin polarization $P_1$ or $P_2$ is increased. For example, the TMR ratio ΔR becomes theoretically infinite when magnetic materials having $P_1=1$ and $P_2=1$ are used for the ferromagnetic free layer 52 and the ferromagnetic pinned layer 54. However, the use of such materials increases the coercive force also, and writing of information with small word line current and bit line current becomes difficult.

SUMMARY OF THE INVENTION

Accordingly, it is a general object of the present invention to provide a novel and useful magnetic random access memory and a fabrication process thereof wherein the foregoing problems are eliminated.

Another object of the present invention is to provide a magnetic random access memory suitable for device miniaturization.

Another object of the present invention is to provide a magnetic random access memory capable of writing information with reduced electric current.

Another object of the present invention is to provide a magnetic random access memory, comprising:

a word line extending in a first direction;

a bit line extending in a second, different direction; and a tunneling magneto-resistive sensor provided between said word line and said bit line in a part where said word line and said bit line cross with each other, said tunneling magneto-resistive sensor comprising:

a first ferromagnetic layer having a fixed magnetization;

a second ferromagnetic layer having a variable magnetization; and a tunneling insulation film interposed between said first ferromagnetic layer and said second ferromagnetic layer, said first ferromagnetic layer comprising a ferromagnetic material having a spin polarization of 0.9 or higher.

According to the present invention, the TMR ratio of the tunneling magneto-resistance sensor is increased as a result of use of the magnetic material having the spin polarization of 0.9 or higher while simultaneously enabling writing of information with a small electric current.

Another object of the present invention is to provide a magnetic random access memory, comprising:

a word line extending in a first direction;

a bit line extending in a second, different direction;

a tunneling magneto-resistive sensor provided between said word line and said bit line in a part where said word line and said bit line cross with each other, said tunneling magneto-resistive sensor comprising: a first ferromagnetic layer having a fixed magnetization; a second ferromagnetic layer having a variable magnetization; and a tunneling insulation film interposed between said first ferromagnetic layer and said second ferromagnetic layer; and a magnetic source applying an offset magnetic field to said tunneling magneto-resistive sensor.

According to the present invention, the magnitude of the magnetic field needed for causing inversion of magnetization in the magnetic free layer is reduced substantially by applying an offset magnetic field to the magnetic sensor.

Other objects and further features of the present invention will become apparent from the following detailed description when read in conjunction with the attached drawings.

BRIEF DESCRIPTION OF THE DRAWINGS

FIG. 13 is a diagram showing the effect of annealing of a $Fe_3O_4$ layer in the fabrication process of the first embodiment.

DETAILED DESCRIPTION OF THE INVENTION

[PRINCIPLE]

Figure 3A:
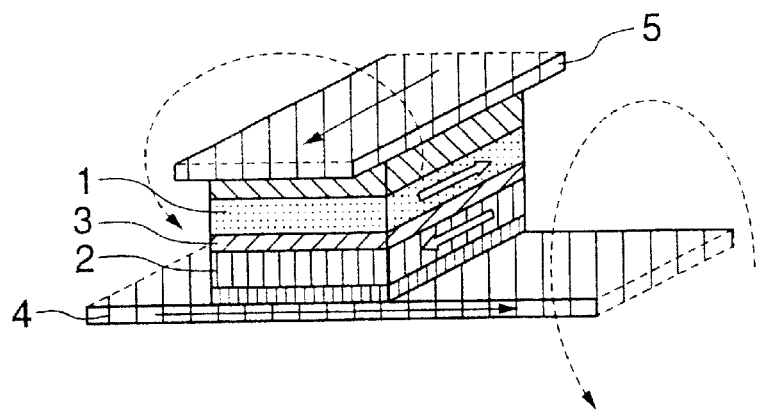
FIGS. 3A and 3B are diagrams showing the principle of the present invention.
Figure 3B:
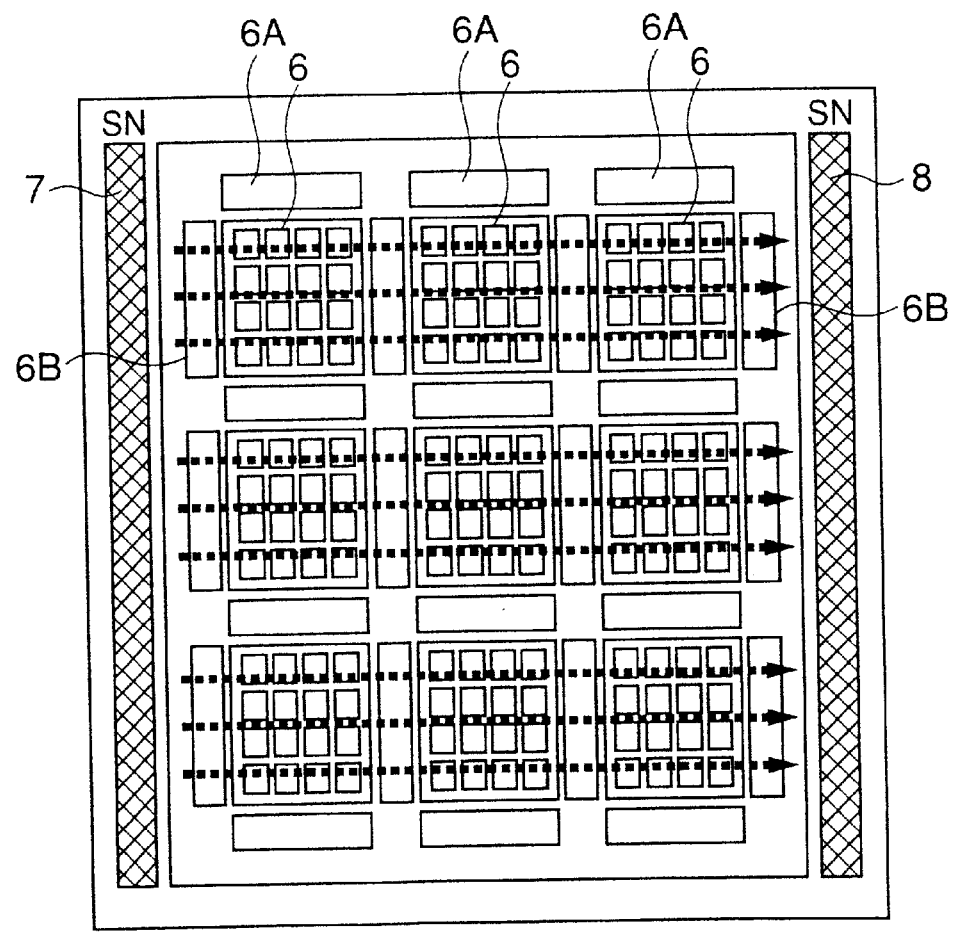

FIGS. 3A and 3B show the principle of the present invention, wherein FIG. 3A shows the construction of a single MRAM cell of the present invention while FIG. 3B shows the overall construction of the MRAM of the present invention.

Referring to FIG. 3A, the MRAM cell of the present invention includes a word line 4 extending in a first direction and a bit line 5 extending in a second, crossing direction, and a TMR sensor is provided between the word line 4 and the bit line 5 in a part where the word line 4 and the bit line 5 cross with each other, wherein the TMR sensor includes a first, pinned ferromagnetic layer 1 having a fixed, or pinned magnetization and a second, free ferromagnetic layer 2 having a variable magnetization, with a tunneling insulation film 3 interposed between the pinned ferromagnetic layer 1 and the free ferromagnetic layer 2.

In the MRAM cell of the present invention, it should be noted that a ferromagnetic material having a spin polarization of 0.9 or higher is used for the pinned ferromagnetic layer 1. On the other hand, a ferromagnetic material having a smaller spin polarization is used for the ferromagnetic free layer 2. As a result of high spin polarization of the pinned ferromagnetic layer 1, a large TMR ratio $\Delta R$ is secured for the TMR sensor while minimizing the electric current needed for writing information into the free ferromagnetic layer 2.

In the example in which the pinned ferromagnetic layer 1 has a spin polarization of 0.9 and the free ferromagnetic layer 2 has a spin polarization of 0.45, a TMR ratio $\Delta R$ of 1.36 ($=2\times0.9\times0.45/(1-0.9\times0.45)$) is obtained, wherein this value of TMR ratio is larger than a conventional value by a factor of 2.5 or more. In order to reduce the magnitude of the word line current and the bit line current at the time of writing of information, it is preferable to reduce the spin polarization of the ferromagnetic free layer 2 to be about 0.5 or less.

In another example, it is possible to achieve a conventional TMR ratio of about 0.5 in the MRAM cell of FIG. 3A by using a ferromagnetic material having a spin polarization of only 0.2, provided that a ferromagnetic material having a spin polarization of about 1.0 is used for the ferromagnetic pinning layer 1. The use of such a ferromagnetic material of small spin polarization for the ferromagnetic free layer 1 reduces the bit line current and word line current needed for writing information into the MRAM cell.

Any of the materials selected from the group consisting of $Fe_3O_4$, NiMnSb, $CrO_2$, and (La, Sr)$MnO_3$ can be used for the ferromagnetic pinned layer 1 as the ferromagnetic material having the spin polarization of about 1.0.

In another aspect, the present invention reduces the magnetic field necessary for causing an inversion of magnetic field in the ferromagnetic free layer, by applying an offset, or augmenting magnetic field.

Referring to FIG. 3B showing the overall construction of a MRAM device, it can be seen that a number of MRAM cells each having the construction of FIG. 3A are assembled to form a memory cell block 6, and a plurality of such memory cell blocks 6 are arranged in rows and columns, together with corresponding peripheral circuits 6A and 6B for each of the memory cell blocks 6, to form the MRAM device. Further, there are provided magnetic sources 7 and 8 such that an offset magnetic field is applied to the MRAM cells in the MRAM device.

In the construction of FIG. 3B, it should be noted that the offset magnetic field is applied within the plane of the ferromagnetic free layer 2, in which the rotation of magnetization takes place, in the direction of hard axis of magnetization of the layer 2.

Figure 1A:
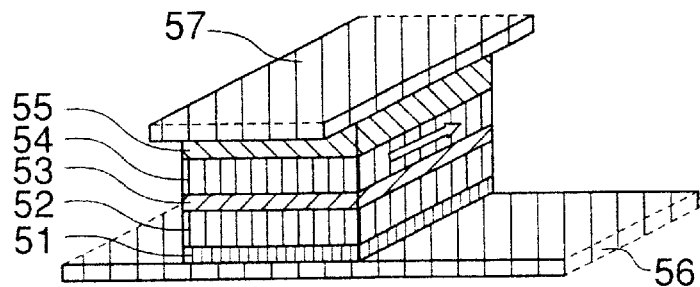
FIGS. 1A–1C are diagrams showing the construction of a MRAM according to a related art.
Figure 1B:
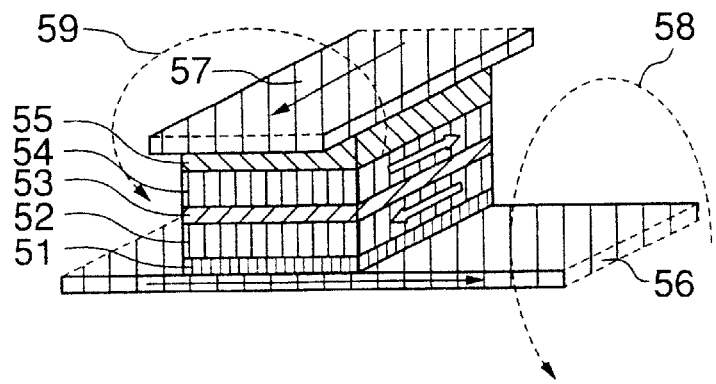
Figure 1C:
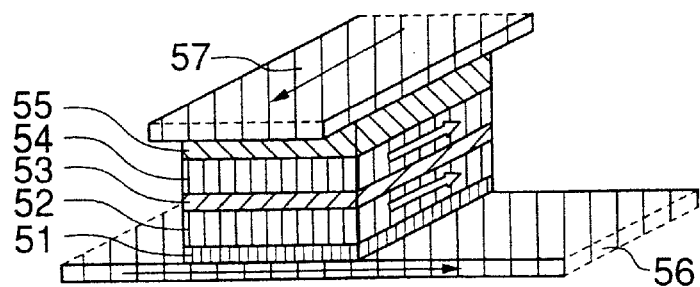
Figure 2:
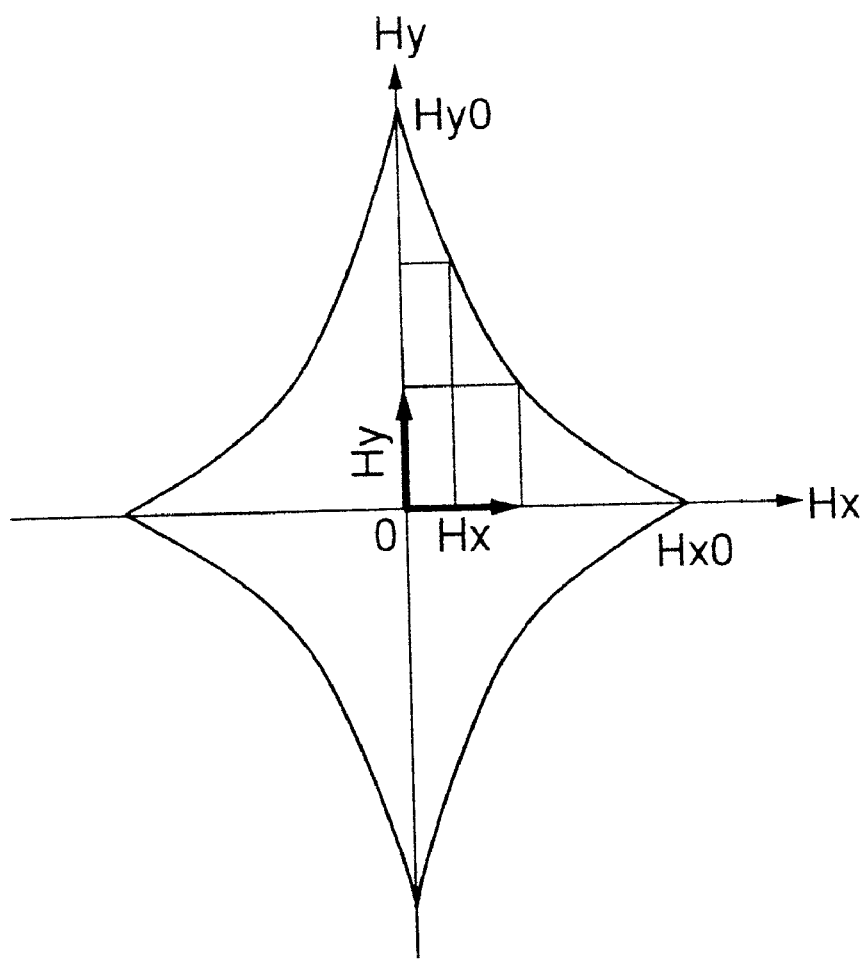
FIG. 2 is a diagram showing the asteroid curve of the MRAM of the related art.

By applying such an external offset magnetic field independently to the synthetic magnetic field created by the bit line current in the bit line 5 and the word line current in the word line 4, it becomes possible to bias the ferromagnetic free layer 2 to an operational point outside the steroid curve of FIG. 2 by a smaller bit line current and a smaller word line current as compared with the case of writing information solely by the bit line current and the word line current.

More specifically, the present invention applies the offset magnetic field $H_{yOffset}$ in the direction of hard axis of magnetization so as to satisfy the relationship:

$$|\delta H_x| < |H_{x0}| \quad \text{(Eqs. 3)}$$

$$|H_{yOffset}| < |H_{y0}|$$

$$|\delta H_y + H_{yOffset}| < |H_{y0}|$$

$$(\delta H_x/H_{x0})^{2/3} + (H_{yOffset}/H_{y0})^{2/3} < 1$$

$$(\delta H_x/H_{x0})^{2/3} + ((\delta H_y + H_{yOffset})/H_{y0})^{2/3} > 1$$

wherein $\delta H_x$ represents the component of the writing magnetic field induced by magnetic fields of the bit line current and the word line current in the direction of easy axis of magnetization, while $\delta H_y$ represents the component of the foregoing writing magnetic field in the direction of hard axis of magnetization. Further, $H_{x0}$ and $H_{y0}$ represent the coercive force of the ferromagnetic free layer 2 in the direction of easy axis of magnetization and in the direction of hard axis of magnetization, respectively.

In the foregoing relationship of Eqs.(3), it should be noted that the relationship $|\delta H_x|<|H_{x0}|$, $|H_{yOffset}|<|H_{y0}|$, $|\delta H_y+H_{yOffset}|<|H_{y0}|$, and $(\delta H_x/H_{x0})^{2/3}+(H_{yOffset}/H_{y0})^{2/3}<1$ are required in order to avoid writing of information into the memory cell adjacent to the selected memory cell, while the relationship $(\delta H_x/H_{x0})^{2/3}+((\delta H_y+H_{yOffset})/H_{y0})^{2/3}<1$ represents the condition for writing information into the selected memory cell.

As will be explained later in more detail, the foregoing relationship indicates that the offset magnetic field $H_{yOffset}$ augments the writing magnetic field $\delta H_y$, and the operational point of the MRAM is moved beyond the closed asteroid region of FIG. 2 with a reduced magnitude for the writing magnetic field components $\delta H_x$ and $\delta H_y$.

[FIRST EMBODIMENT]

FIGS. 4A–4I represent the fabrication process of a MRAM 10 according to a first embodiment of the present invention.

Figure 4A:
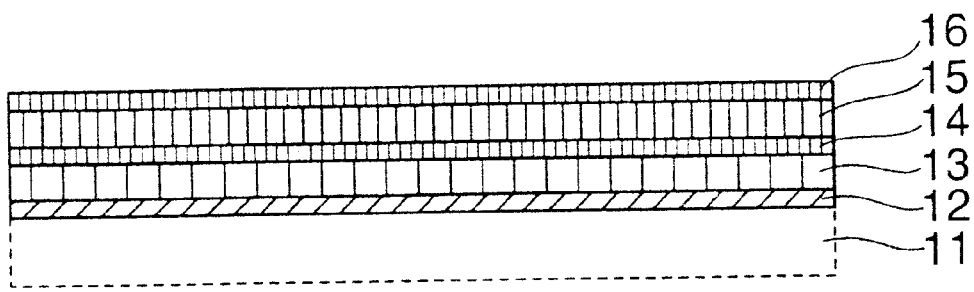
FIGS. 4A–4I are diagrams showing the fabrication process of a MRAM according to a first embodiment of the present invention.

Referring to FIG. 4A, a Si substrate 11 is covered with an interlayer insulation film 12 of $SiO_2$, and a Cu layer 13, a $WSi_2$ layer 14, a NiFe layer 15 and an Al layer 16 are deposited consecutively on the $SiO_2$ interlayer insulation film 12 by a sputtering process with respective thicknesses of 0.2 $\mu$m, 100 nm, 5 nm and 2.0 nm, respectively. Preferably, the NiFe layer 15 has a composition of $Ni_{50}Fe_{50}$.

Figure 4B:
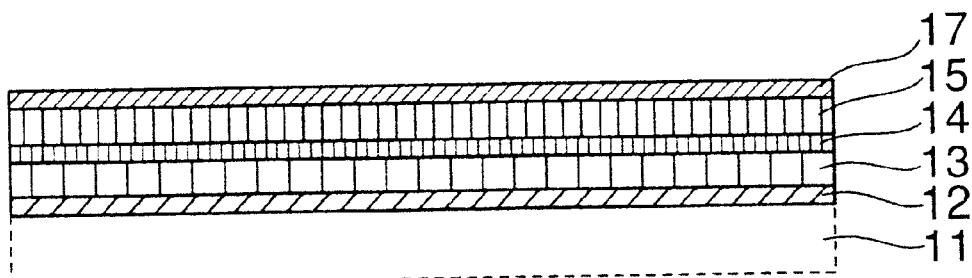

Next, in the step of FIG. 4B, the surface of the Al layer 16 is subjected to an oxidizing process to form a tunneling oxide film 17 thereon with a thickness of about 3.0 nm. The tunneling oxide film 17 thus formed typically has a non-stoichiometric composition represented as $AlO_x$ and contains oxygen defect.

Figure 4C:
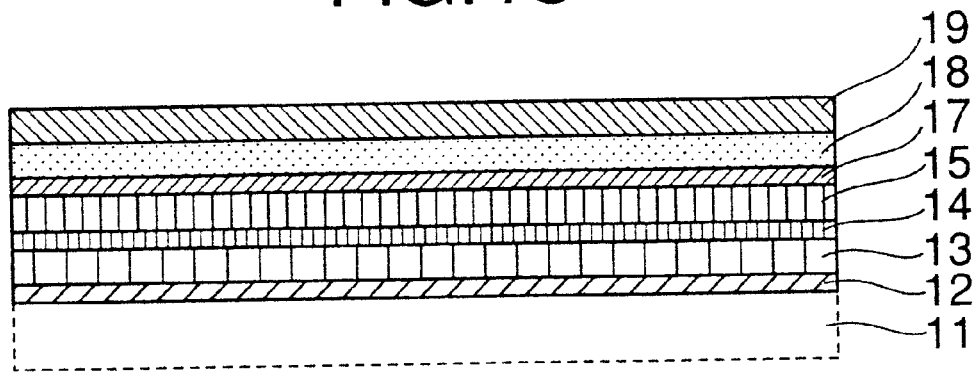

Next, in the step of FIG. 4C, a $Fe_2O_3$ layer 18 and a MnFe anti-ferromagnetic layer 19 are deposited on the tunneling oxide film 17 consecutively by a sputtering process with respective thicknesses of 20 nm and 100 nm, followed by a thermal annealing process conducted under the existence of a magnetic field of preferably 3000 Oe or more in the elongating direction of the bit line to be formed. With this, the MnFe anti-ferromagnetic layer 19 fixes the magnetization of the $Fe_2O_3$ layer 18 in the elongating direction of the bit line, and thus, there occurs a pinning of magnetization in the $Fe_2O_3$ layer 18 by the MnFe anti-ferromagnetic layer 19.

Figure 4D:
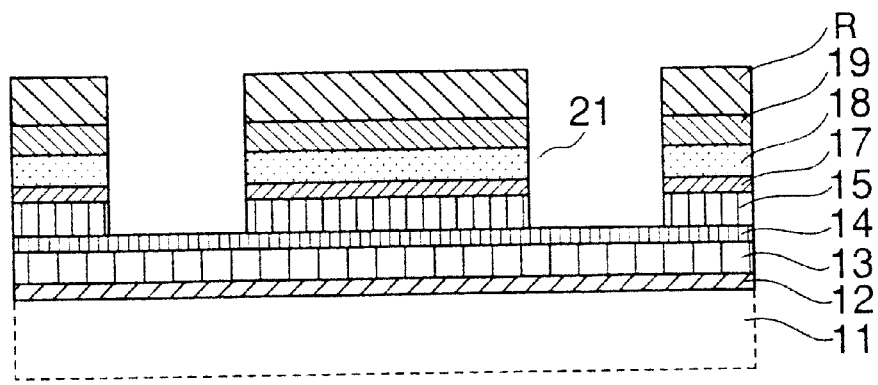

Next, in the step of FIG. 4D, a line-and-space pattern is formed on the structure of FIG. 4C by a resist pattern R so as to extend in the elongating direction of the word line to be formed, such that each line pattern has a width of 0.2 µm and each space pattern has a width of 0.1 µm, and an ion milling process is applied to the structure of FIG. 4C while using the resist pattern R as a mask, until the WSi layer 14 is exposed. As a result of the ion milling process, the layers on the WSi layer 14, including the MnFe anti-ferromagnetic layer 19, the $Fe_3O_4$ layer 18, the Al layer 16 including the $AlO_x$ layer 17 and the NiFe layer 15, are patterned in conformity with the line-and-space pattern of the resist pattern R, and there are formed mesa stripes 21 each having a width of 0.2 µm with a separation of 0.1 µm.

Figure 4E:
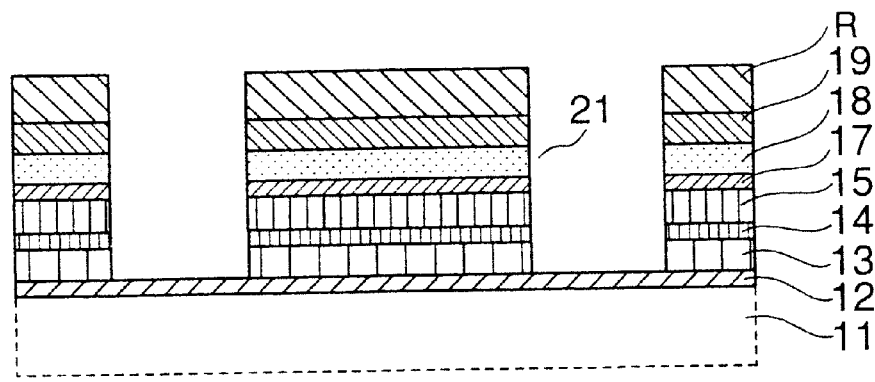

Next, in the step of FIG. 4E, a reactive-ion etching process is applied to the WSi layer 14 and the Cu layer 13 exposed in the structure of FIG. 4D between the mesa stripes 21 while using the same resist pattern R as a mask, and there are formed a number of word line patterns 22 extending parallel with each other, each having a width of 0.2 µm.

Figure 4F:
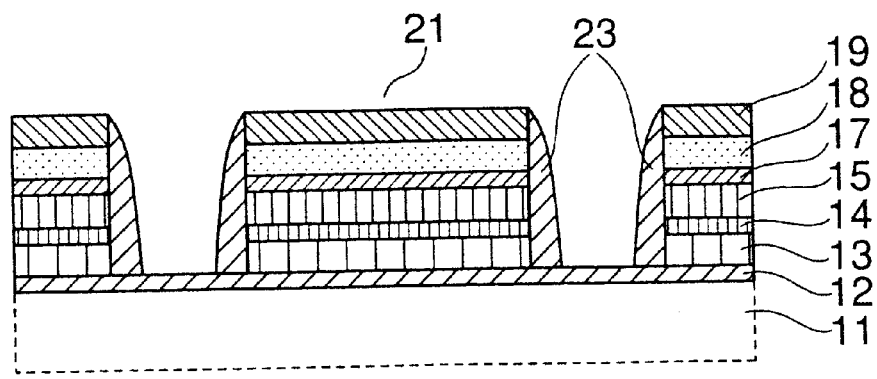

Next, in the step of FIG. 4F, the resist pattern R is removed and an $SiO_2$ film is deposited on the structure thus obtained uniformly. Further, an anisotropic etching process acting generally perpendicularly to the principal surface of the substrate 11 is applied to the $SiO_2$ film thus formed, and there are formed side wall insulation films 23 on the side walls of each mesa stripe 21.

Figure 4G:
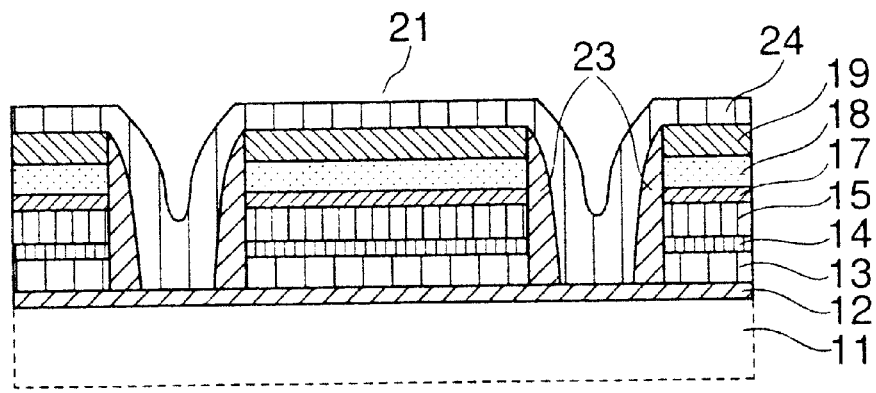

Next, in the step of FIG. 4G, a Cu layer 24 is deposited on the entire surface of the structure of FIG. 4F by a sputtering process, with a thickness of about 0.2 µm.

Figure 4H:
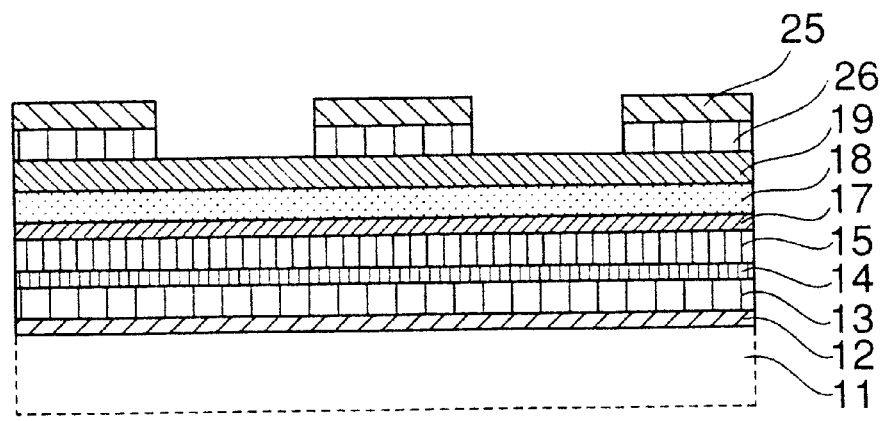

Next, in the step of FIG. 4H, a resist pattern 25 is formed on the structure of FIG. 4G and the Cu layer 24 is patterned while using the resist pattern 25 as a mask. As a result of the patterning of the Cu layer 25, bit lines 26 each extending in a crossing direction to the word lines 22 are formed with a 0.1 µm line-and-space pattern as represented in FIG. 4H, wherein it should be noted that FIG. 4H shows a cross-section taken in a crossing direction to the cross-section of FIG. 4G.

Figure 4I:
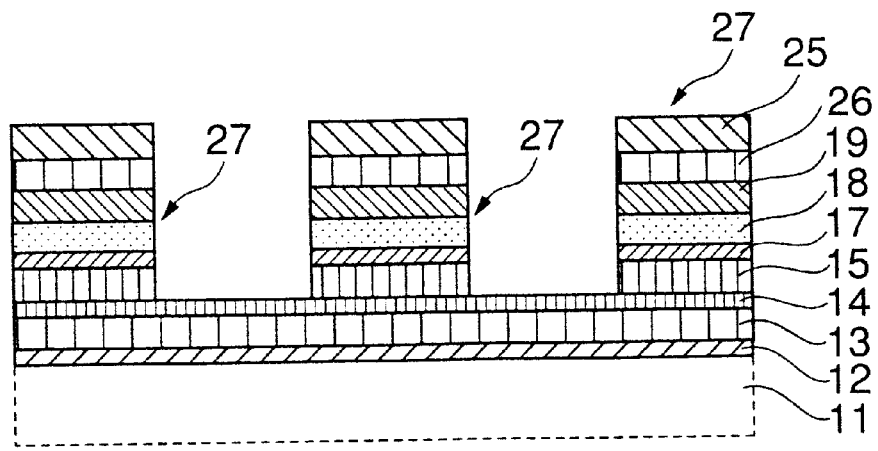

Next, in the step of FIG. 4I, an ion milling process is applied to the structure of FIG. 4H while using the same resist pattern 25 as a mask until the WSi layer 14 is exposed, and there is formed a row and column formation of rectangular MRAM cells 27 each having a size of 0.1 µm×0.2 µm. In each MRAM cell 27, it should be noted that the NiFe layer 15 constitutes the ferromagnetic free layer of the MRAM 10 while the $Fe_2O_3$ layer 18 constitutes the ferromagnetic pinned layer having the magnetization thereof pinned by the anti-ferromagnetic pinning layer, which is provided by the anti-ferromagnetic layer 26. In FIG. 4I, too, a cross-section taken in a direction perpendicular to the cross-section of FIG. 4G is represented.

Figure 5A:
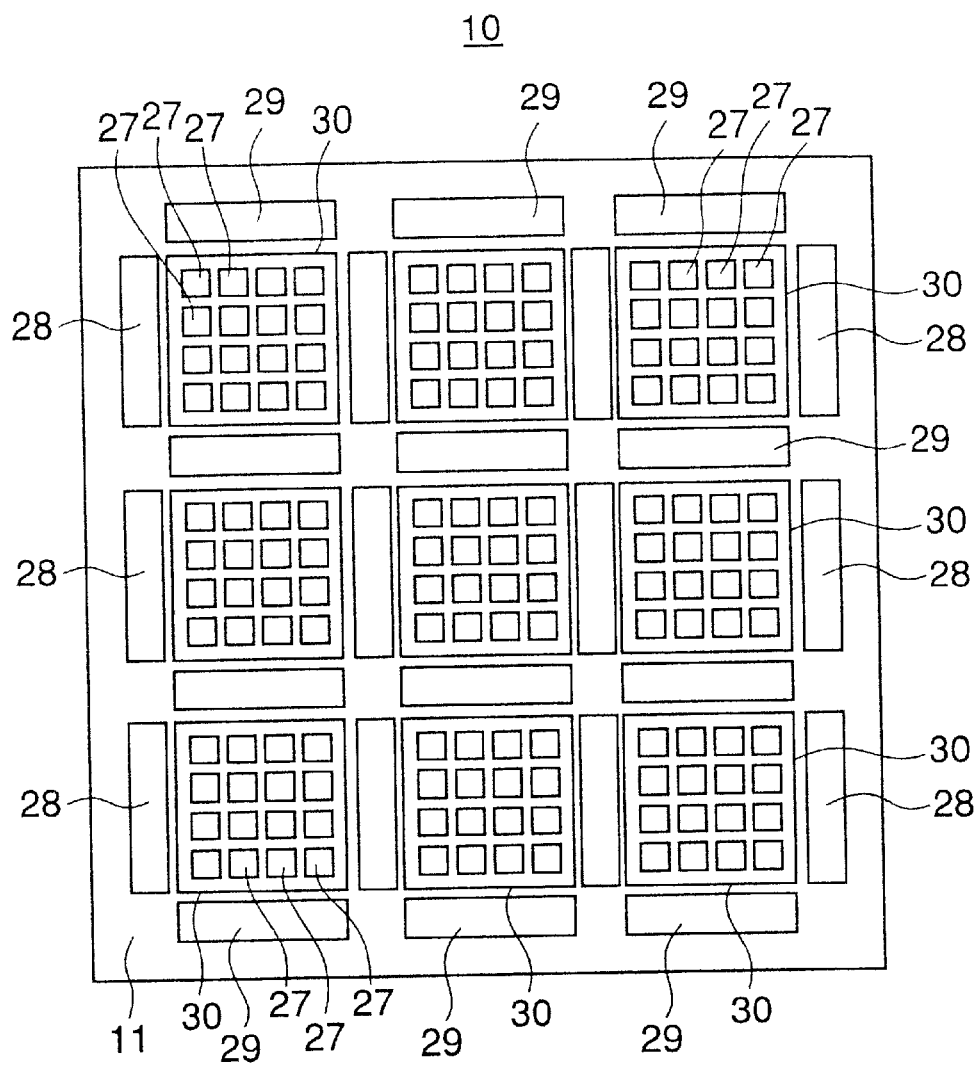
FIGS. 5A and 5B are diagrams showing the construction of a MRAM of the first embodiment.
Figure 5B:
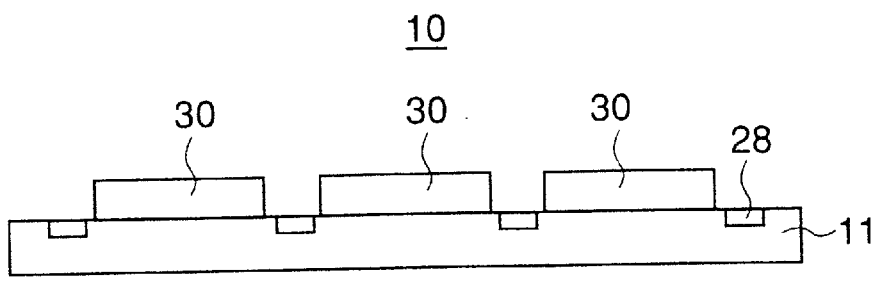

FIGS. 5A and 5B show the overall construction of the MRAM 10 of the present embodiment respectively in a plan view and in a cross-sectional view, wherein it can be seen that the MRAM cells 27 of FIG. 4I are arranged in a row and column formation to form a number of memory cell blocks 30 and that there are provided peripheral circuits 28 and 29 adjacent to each memory cell block 30 in the MRAM. Thereby, it should be noted that the word lines 22 of the MRAM cells are connected to a word line driver provided in the peripheral circuit 28 in each memory cell block 30 and that the bit lines 26 are connected to a bit line driver provided in the peripheral circuit 29.

In the case the NiFe ferromagnetic layer 15 has the spin polarization $P_2$ of 0.45, the TMR ratio ΔR is represented as $\Delta R=2\times1\times0.45/(1-1\times0.45)\approx1.636$, in view of the fact that the spin polarization $P_1$ of 1.0 for $Fe_2O_3$ used for the ferromagnetic pinned layer 18. It should be noted that value of the TMR ratio ΔR thus obtained is larger than that of a conventional MRAM cell that uses an ordinary NiFe alloy for the ferromagnetic pinned layer 18 by a factor of three or more.

In order to reduce the bit line current and the word line current needed at the time of writing or erasing of information, the NiFe free layer 15 may have a composition that reduces the coercive force thereof, by adding thereto an impurity element such as Al or Cu. As long as $Fe_2O_3$ having the spin polarization $P_1$ of 1 is used for the ferromagnetic pinning layer 18, a TMR ratio ΔR of as much as 0.5 is achieved even when a NiFe alloy having the spin polarization $P_1$ of as small as 0.2 is used for the ferromagnetic free layer 15. Note the relationship:

$\Delta R=2\times1\times0.2/(1-1\times0.2)=0.5$.

With the writing electric current thus reduced, the MRAM 10 of the present embodiment is suitable for constructing a high-integration MRAM integrated circuit.

FIG. 13 shows the effect of the annealing process of the $Fe_3O_4$ layer 18 in the step of FIG. 4C conducted under the existence of an external magnetic field. As noted previously, the $Fe_3O_4$ layer 18 has a thickness of 30 nm and annealed at 300° C., wherein it can be seen that the magnetization B of the $Fe_3O_4$ layer 18 is increased substantially when annealed under the existence of the magnetic field of about 1000 Oe or more, preferably about 3000 Oe or more. Such an annealing process of the $Fe_3O_4$ layer 18 may be conducted after the step of FIG. 4I, if appropriate.

[SECOND EMBODIMENT]

Figure 6A:
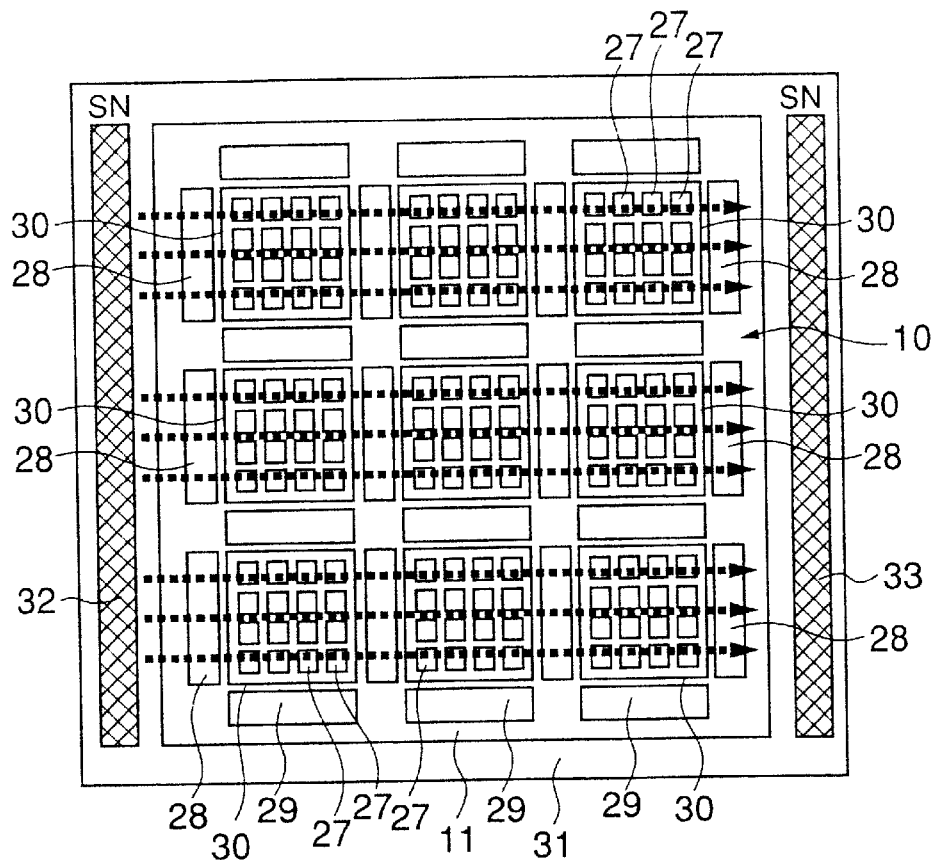
FIGS. 6A and 6B are diagrams showing the construction of a MRAM of the second embodiment.
Figure 6B:
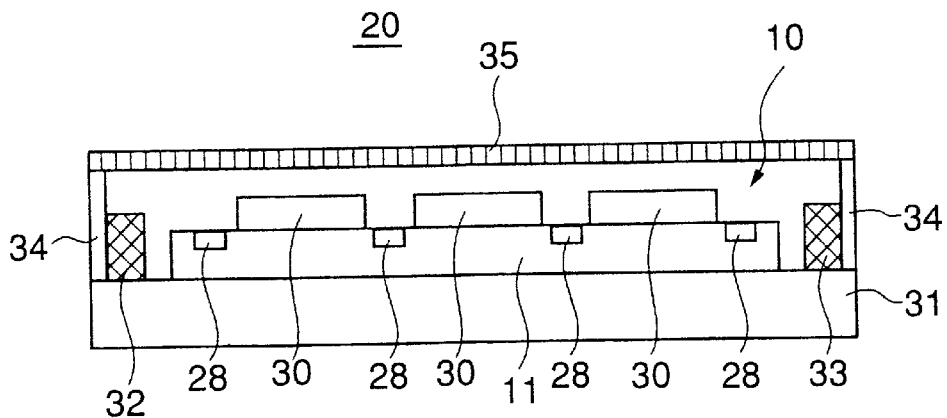

Next, a second embodiment of the MRAM of the present invention will be described with reference to FIGS. 6A and 6B, wherein FIG. 6A shows a MRAM 20 of the second embodiment in a plan view while FIG. 6B shows the MRAM 20 in a cross-sectional view. In the drawings, those parts corresponding to the parts described previously are designated by the same reference numerals and the description thereof will be omitted.

Referring to FIGS. 6A and 6B, the Si substrate 11 carrying the MRAM 10 of the previous embodiment is mounted on a supporting substrate 31 such that the memory cell blocks 30 on the substrate 11 are covered by a magnetic shield 35, wherein the MRAM 20 of the present embodiment further includes a pair of permanent magnets 32 and 33 provided on opposing side walls 34 of a magnetic material such as a soft iron, such that the permanent magnets 32 and 33 oppose with each other across the MRAM 10 of the previous embodiment. According to such a construction, the permanent magnets 32 and 33 form a closed magnetic circuit and an offset magnetic field $H_{yOffset}$ is applied to each of the MRAM cells 27 formed on the substrate 11. Thereby, it should be noted that the magnets 32 and 33 are disposed such that the direction of the offset magnetic field $H_{yOffset}$ coincides with the direction of the hard axis of magnetization $H_y$ of each MRAM cell.

Figure 7:
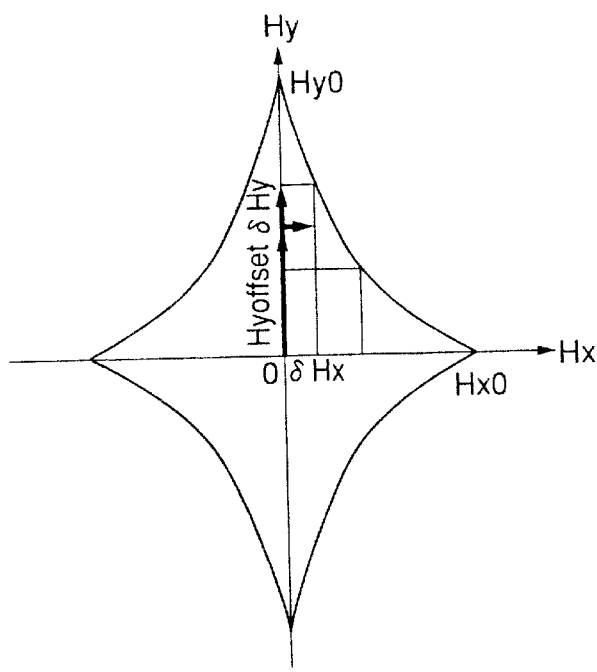
FIG. 7 is a diagram showing the asteroid curve for the MRAM of FIGS. 6A and 6B.

FIG. 7 shows the asteroid curve similar to that shown in FIG. 2 in the case the offset magnetic field $H_{yOffset}$ is applied by the permanent magnets 32 and 33 in the direction of the hard axis of magnetization Hy of the MRAM cell 27.

Referring to FIG. 7, it can be seen that the operational point for the writing operation is shifted in the direction of the axis $H_y$ and the magnetic field strength $\delta H_x$ and $\delta H_y$ necessary for writing information is reduced substantially as compared with the case of FIG. 2 in which no such an offset magnetic field is applied.

In the present embodiment, the writing magnetic field ($\delta H_x$, $\delta H_y$) to be induced by the bit line current and the word line current at the time of writing should satisfy the relationship $$(\delta H_x/H_{x0})^{2/3}+((\delta H_y+H_{yOffset})/H_{y0})^{2/3}>1.$$

From this relationship, it will be understood that the magnitude of the writing magnetic field components $\delta H_x$ and $\delta H_y$ can be reduced when the magnitude of the offset magnetic field $H_{yOffset}$ is increased.

Figure 8:
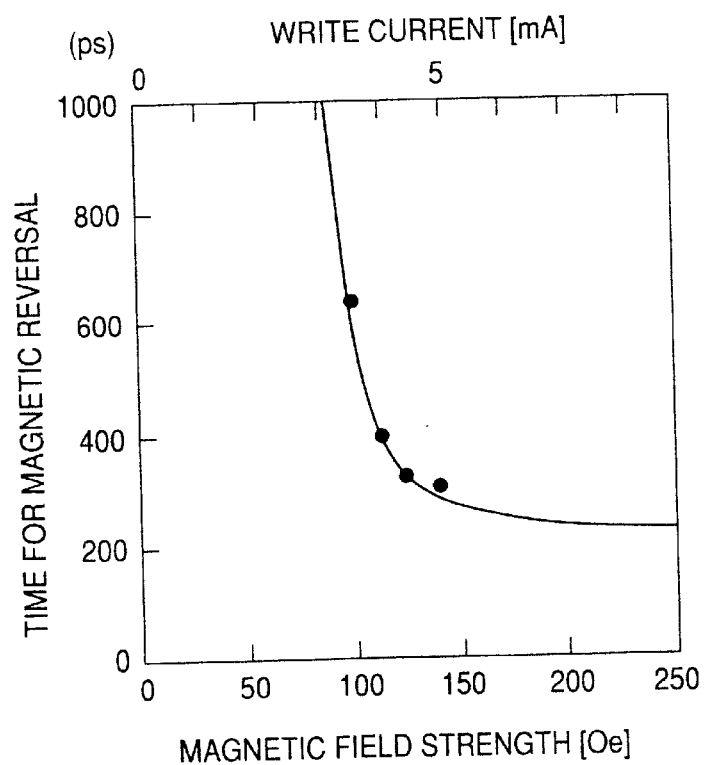
FIG. 8 is a diagram showing the effect of the MRAM of FIGS. 6A and 6B.

FIG. 8 shows the relationship between the write current and the time needed for causing a magnetic reversal in the NiFe free layer 15 in the MRAM cell 27 for the case in which the MRAM cell 27 has a size of 0.1 μm×0.2 μm×0.02 μm and the NiFe free layer 15 is separated from the bit line pattern 26 and the word line pattern 22 by 0.1 μm. In FIG. 8, the write current represented by the top horizontal axis represents the bit line current in the bit line pattern 26, provided that the same electric current is caused to flow in the word line pattern 22 at the same time as the word line current. Further, the bottom horizontal axis represents the corresponding strength of the magnetic field induced by the each of the bit line current and word line current.

Referring to FIG. 8, it can be seen that the time needed for causing the magnetic reversal in the NiFe free layer 15 increases with decreasing magnitude of the write current, and that it is necessary to induce a magnetic field of 80 Oe or more for each of the writing magnetic field components $\delta H_x$ and $\delta H_y$ in order to cause the magnetic reversal within the duration of 1 ns. In such a case, it is necessary that each of the bit line current and the word line current has a magnitude of 3 mA or more.

In the case the offset magnetic field $H_{yOffset}$ is applied to the MRAM cell in the present embodiment of FIGS. 6A and 6B, on the other hand, each of the writing magnetic field components $\delta H_x$ and $\delta H_y$ is required to have a magnitude of only 40 Oe for causing the desired magnetic reversal in the NiFe free layer 15 within the duration of 1 ns.

Hereinafter, this decrease of the electric current, and hence electric power, will be explained in more detail with reference to FIGS. 9A–9E, showing the result of simulation for the case in which an offset magnetic field $H_{yOffset}$ of 40 Oe is applied while causing to flow a word line current $I_{wx}$ and a bit line current $I_{wy}$ of 1 mA in the word line pattern 22 and the bit line pattern 26, respectively.

Figure 9A:
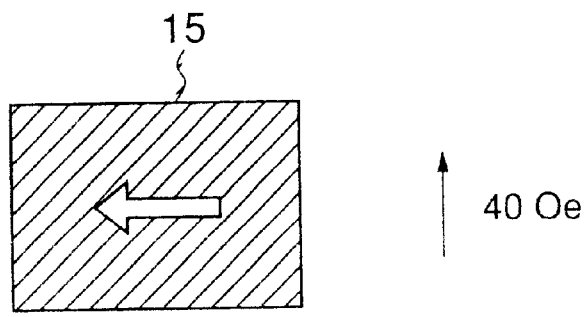
FIGS. 9A–9E are diagrams explaining the writing operation of the MRAM of FIGS. 6A and 6B.

Referring to FIG. 9A showing an initial state of magnetization of the NiFe free layer 15 of a selected MRAM cell 27, the offset magnetic field $H_{yOffset}$ of 40 Oe is applied to the NiFe free layer 15 in the upward direction within the plane of the drawing as represented by an arrow, and the NiFe free layer 15 has a magnetization as represented by a white arrow pointing to the left. In the initial state of FIG. 9A, there is no word line current $I_{wx}$ or bit line current $I_{wy}$ flowing through the word line pattern 22 or bit line pattern 26. Thus, there holds a relationship $I_{wx}=0$ and $I_{wy}=0$.

When a word line current $I_{wx}$ of 1 mA and a bit line current $I_{wy}$ of 1 mA are caused to flow through the word line pattern 22 and the bit line pattern 26, on the other hand, there is induced a writing magnetic field with the components $\delta H_x$ and $\delta H_y$ such that $\delta H_x=\delta H_y=20$ Oe. Thereby, there occurs a reversal of magnetization in the NiFe layer 15 within the short duration of 1 ns, and high-speed rewriting or erasing of information is achieved.

Figure 9B:
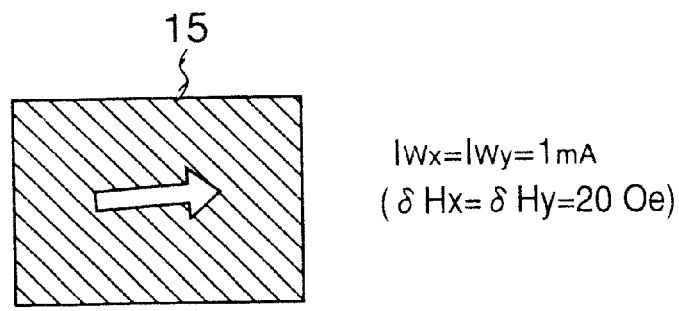
Figure 9C:
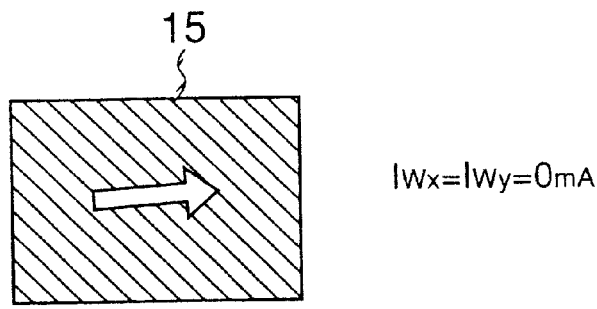

FIG. 9C shows the state in which the word line current $I_{wx}$ and the bit line current $I_{wy}$ are interrupted in the state of FIG. 9B. In other words, there holds a relationship $I_{wx}=0$ and $I_{wy}=0$ in FIG. 9C.

Figure 9D:
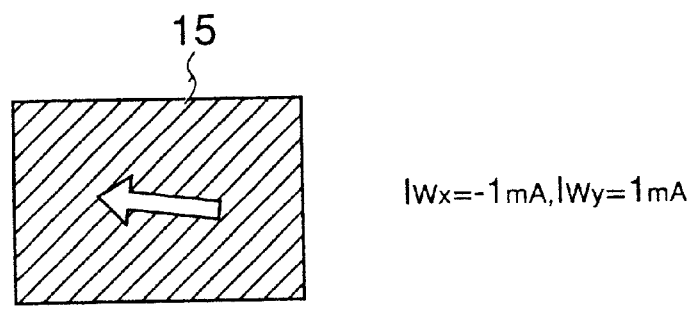

Next, in the step of FIG. 9D, the direction of the word line current is reversed and a word line current $I_{wx}$ of −1 mA and a bit line current $I_{wy}$ of 1 mA are caused to flow through the word line pattern 22 and the bit line pattern 26 respectively, and the magnetization of the NiFe layer 15 is reversed again as represented by a white arrow therein, wherein the reversal of the magnetization occurs within the short duration of 1 ns. In the case of FIG. 9D, it should be noted that the word line current flows in the direction opposite to the word line current in the case of FIG. 9B. As a result of the magnetic reversal, the information written into the NiFe free layer 15 is rewritten or erased with high speed.

Figure 9E:
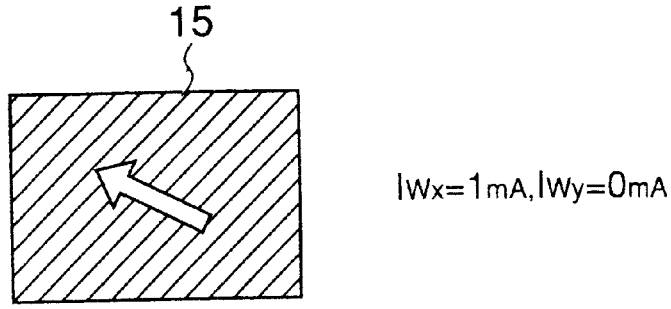

FIG. 9E shows the magnetization of the NiFe free layer 15 of an adjacent MRAM cell, which is not selected.

Referring to FIG. 9E, a word line current $I_{wx}$ of 1 mA and a bit line current $I_{wy}$ of 0 mA or a word line current $I_{wx}$ of 0 mA or a word line current $I_{wy}$ of 0 mA and a bit line current Iwy of 1 mA are caused to flow through the word line pattern 22 and the bit line pattern 26 respectively, while it should be noted that it takes more than 99 seconds for the writing magnetic field thus induced to cause the reversal of magnetization in such an adjacent, non-selected MRAM cell. Thus, as long as the duration of applying the word line current $I_{wx}$ and the bit line current $I_{wy}$ is limited shorter than 99 ns, there occurs no erasing or rewriting of information in the adjacent MRAM cell.

After such erasing or rewriting of information, the magnetization of the NiFe free layer 15 of the adjacent MRAM cell points in the diagonal direction of the rectangular MRAM cell, in which direction the size of the MRAM cell is maximum.

It should be noted that such selective rewriting or erasing of information to a selected MRAM cell is achieved when there holds a relationship:

$$|\delta H_x| < |H_{x0}| \quad \text{(Eqs. 4)}$$

$$|H_{yOffset}| < |H_{y0}|$$

$$|\delta H_y + H_{yOffset}| < |H_{y0}|$$

$$(\delta H_x/H_{x0})^{2/3} + (H_{yOffset}/H_{y0})^{2/3} < 1$$

$$(\delta H_x/H_{x0})^{2/3} + ((\delta H_y + H_{yOffset})/H_{y0})^{2/3} > 1,$$

wherein it should be noted that the relationship $|\delta H_x|<|H_{x0}|$, $|H_{yOffset}|<|H_{y0}|$, $|\delta H_y+H_{yOffset}|<|H_{y0}|$, and $(\delta H_x/H_{x0})^{2/3}+(H_{yOffset}/H_{y0})^{2/3}<1$ of the foregoing Eqs.(4) are required in order to avoid writing of information into the memory cell adjacent to the selected memory cell, while the last relationship of $(\delta H_x/H_{x0})^{2/3}+((\delta H_y+H_{yOffset})/H_{y0})^{2/3}>1$ represents the condition for writing information into the selected MRAM cell.

Thus, the present embodiment can successfully reduce the writing current as a result of application of the offset magnetic field $H_{yOffset}$ in the direction of hard axis of magnetization of the ferromagnetic free layer 15.

[THIRD EMBODIMENT]

Figure 10A:
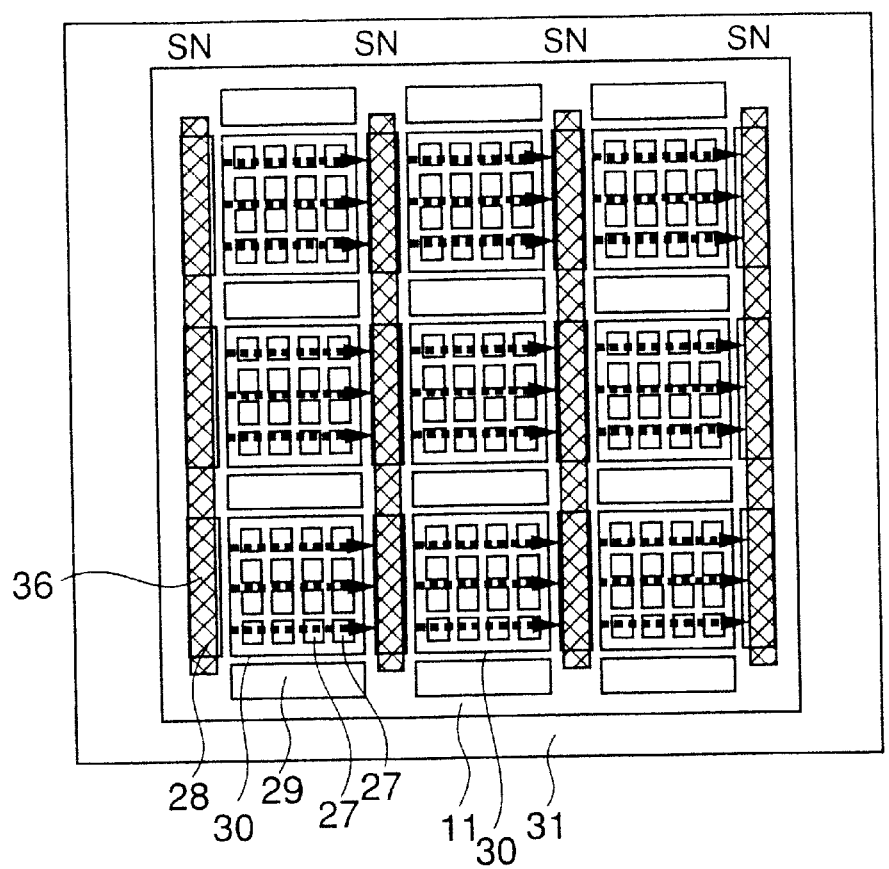
FIGS. 10A and 10B are diagrams showing the construction of a MRAM according to a third embodiment of the present invention.
Figure 10B:
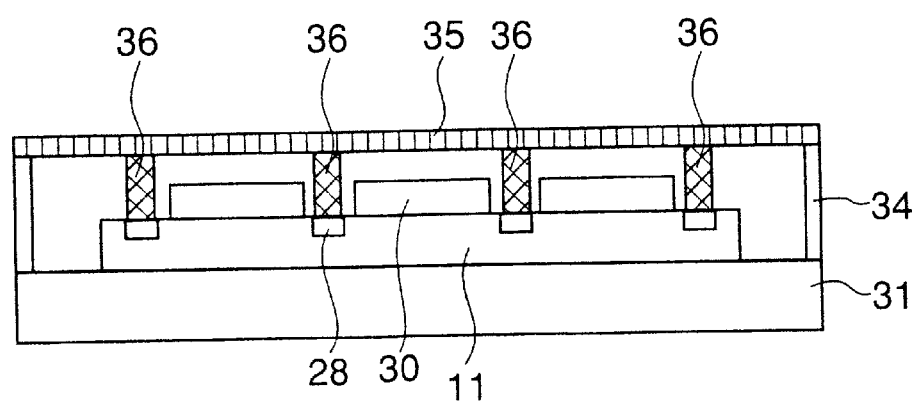

Next, a third embodiment of the MRAM of the present invention will be described with reference to FIGS. 10A and 10B, wherein FIG. 10A shows a MRAM 40 of the present embodiment in a plan view while FIG. 10B shows the MRAM 40 in a cross-sectional view. In the drawings, those parts corresponding to the parts described previously are designated by the same reference numerals and the description thereof will be omitted.

Referring to FIGS. 10A and 10B, the MRAM 10 of the preceding embodiment is now mounted on the support substrate 31 and is covered with the magnetic shield 35 similarly to the case of the MRAM 20 of the previous embodiment, except that there are provided a number of permanent magnets 36 at both lateral sides of each memory cell block 30 so as to apply thereto the offset magnetic field $H_{yOffset}$. Similarly as before, the permanent magnets 36 are arranged such that the offset magnetic field $H_{yOffset}$ points in the direction of hard axis of magnetization Hy.

As a result of the construction of FIGS. 10A and 10B, it becomes possible to apply the offset magnetic field $H_{yOffset}$ to each of the MRAM memory blocks 30 with a uniform strength.

[FOURTH EMBODIMENT]

Figure 11A:
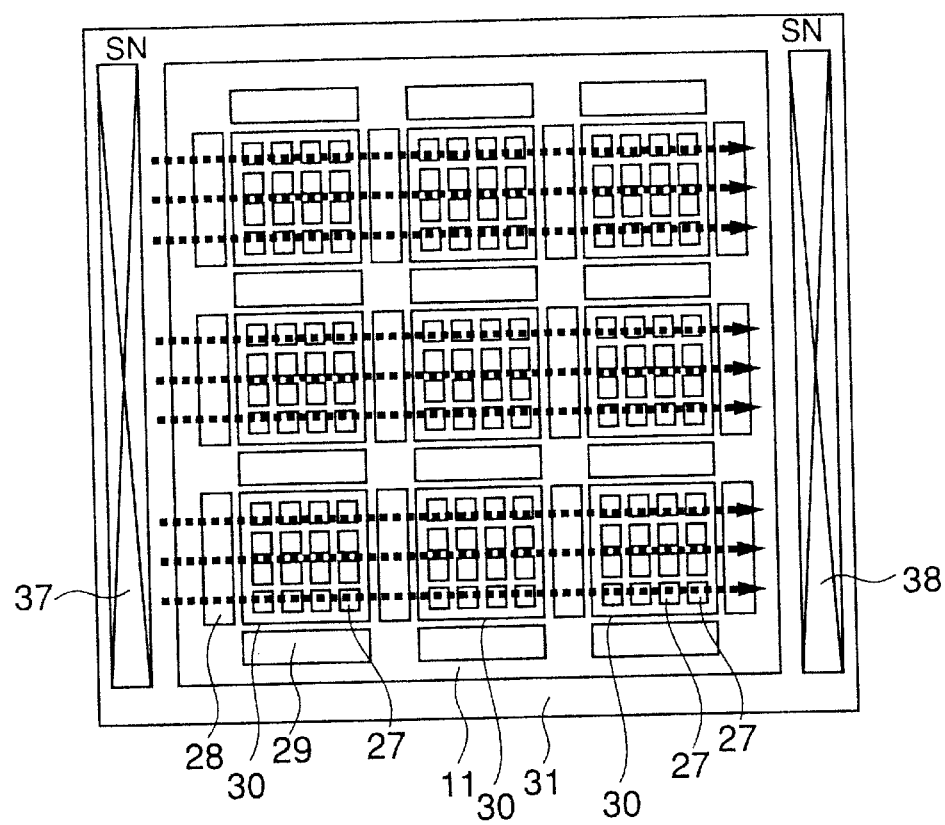
FIGS. 11A and 11B are diagrams showing the construction of a MRAM according to a fourth embodiment of the present invention.
Figure 11B:
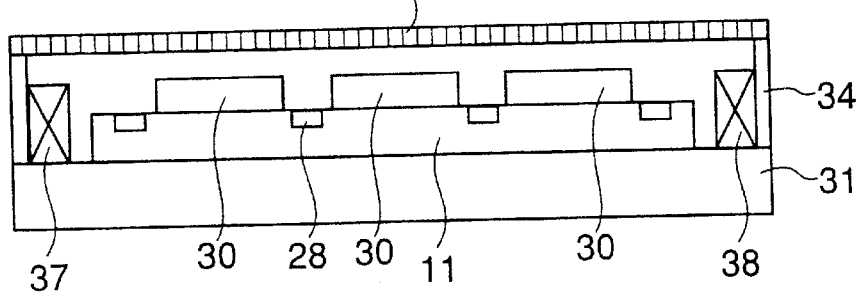

Next, a fourth embodiment of the MRAM of the present invention will be described with reference to FIGS. 11A and 11B wherein FIG. 11A shows a MRAM 60 of the present invention in a plan view while FIG. 11B shows the MRAM 60 in a cross-sectional view. In the drawings, those parts corresponding to the parts described previously are designated by the same reference numerals and the description thereof will be omitted.

Referring to FIGS. 11A and 11B, the MRAM 60 has a construction similar to that of the MRAM 20 of the previous embodiment except that the permanent magnets 32 and 33 are replaced with solenoids 37 and 38 respectively, and the solenoids 37 and 38 apply the offset magnetic field $H_{yOffset}$ to the memory cells 27 in the memory cell blocks 30 when writing or erasing information.

According to the present embodiment, the information written into MRAM cells 27 is held stably in the holding mode of the MRAM 60 even when there is a magnetic disturbance applied to the MRAM cells 27, as there is no offset magnetic field $H_{yOffset}$ applied to the MRAM cells 27.

While it is noted that energization of the solenoids 37 and 38 requires electric power, such energization of the solenoids 37 and 38 is limited only to the duration of writing or erasing of information, and there arises no serious problem of increased electric power consumption that impedes device miniaturization in the MRAM 60 of the present embodiment.

[FIFTH EMBODIMENT]

Figure 12A:
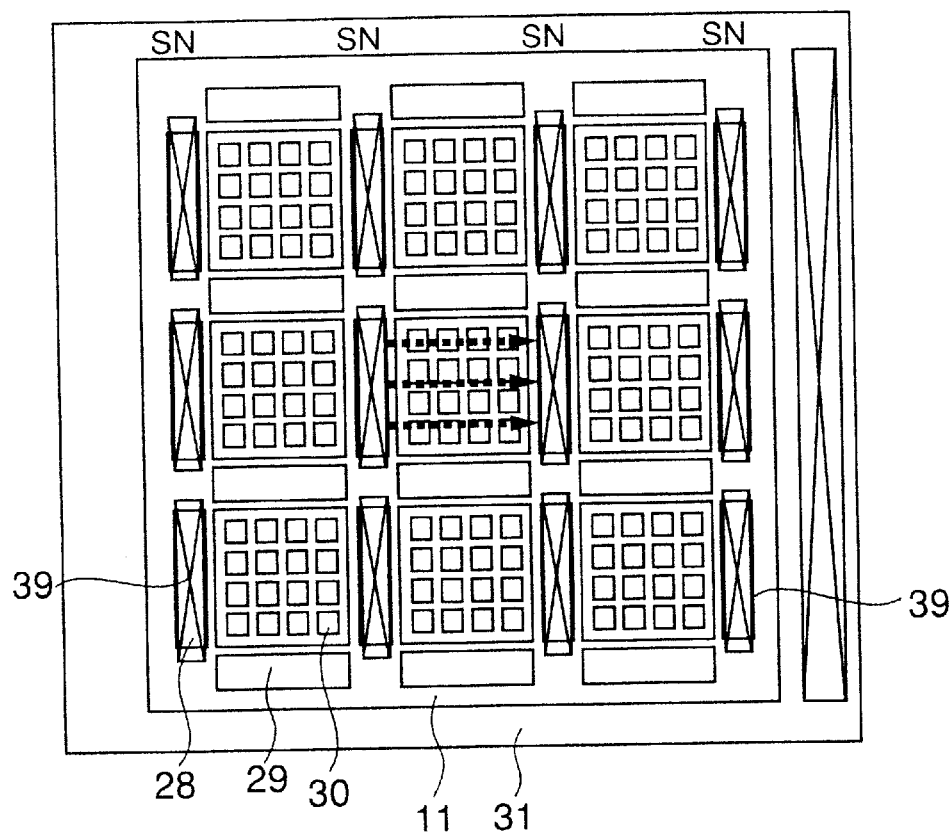
FIGS. 12A and 12B are diagrams showing the construction of a MRAM according to a fifth embodiment of the present invention.
Figure 12B:
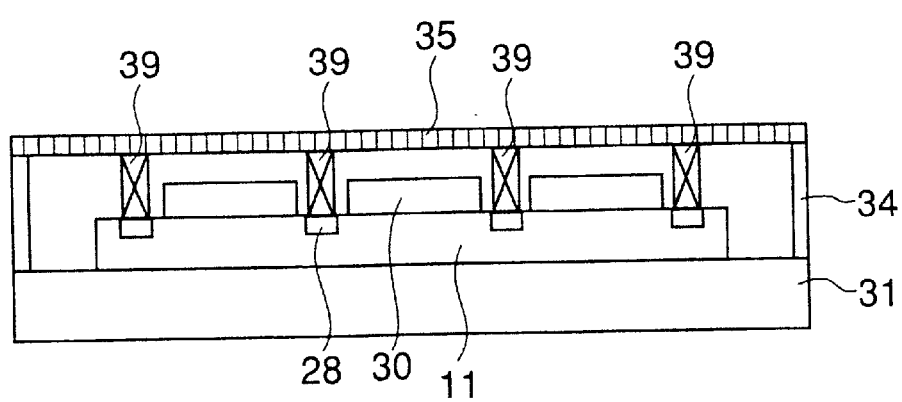

Next, a fifth embodiment of the MRAM of the present invention will be described with reference to FIGS. 12A and 12B wherein FIG. 12A shows a MRAM 80 of the present invention in a plan view while FIG. 12B shows the MRAM 80 in a cross-sectional view. In the drawings, those parts corresponding to the parts described previously are designated by the same reference numerals and the description thereof will be omitted.

Referring to FIGS. 12A and 12B, the MRAM 80 has a construction similar to that of the MRAM 40 of the previous embodiment except that the permanent magnets 36 are replaced with solenoids 39, and the solenoids 39 apply the offset magnetic field $H_{yOffset}$ to the memory cells 27 in the memory cell blocks 30 when writing or erasing information.

According to the present invention, the solenoids 39 for a selected memory cell block 30, in which writing or erasing of information is to be carried out, are selectively activated and the electric power consumption is reduced further as compared with the MRAM 60 of the previous embodiment.

[MODIFICATIONS]

In the foregoing embodiments, it is also possible to use other ferromagnetic materials having a spin polarization of larger than about 0.45, preferably larger than about 0.9 for the ferromagnetic free layer 15, including NiMnSb, PtMnSn, $CrO_2$ or $(La,Sr)MnO_3$ for the ferromagnetic pinned layer 18 in place of $Fe_3O_4$, wherein it should be noted that the materials noted above provides the magnetic polarization $P_1$ of about 1.

Further, the ferromagnetic free layer 15 of the MRAM is not limited to the NiFe alloy having the spin polarization $P_2$ of 0.45 but a CoFe alloy having a spin polarization $P_2$ of 0.55 may be used also for this purpose. From the view point of reducing the writing electric current, it is preferable to use a ferromagnetic material having a spin polarization $P_2$ of about 0.5 or smaller, preferable about 0.3 or smaller. The ferromagnetic material having such a small spin polarization may contain an impurity element.

Further, an insulating material other than AlOx may be used to the tunneling insulation film 17 in the FRAM cell 27 of the present invention.

Further, anti-ferromagnetic materials other than MnFe, such as PdPtMn, may also by used for the anti-ferromagnetic pinning layer 19. Thereby, the use of those anti-ferromagnetic materials that do not show the desired anti-ferromagnetism when formed on a ferromagnetic material of a specific crystal structure and used for the ferromagnetic layer 18 should be avoided.

As long as the MRAM has the construction of applying the offset magnetic field $H_{yOffset}$, any conventional combination of materials may be used for the MRAM cell 27, including those that use a NiFe alloy known as "Permalloy" for the ferromagnetic layers 15 and 18.

In addition, it should be noted that the MRAM of the present invention may use a spin valve sensor in place of the TMR sensor. In this case, the tunneling insulation film 17 may be replaced with a nom-magnetic metal layer such as a Cu layer in the MRAM cell 27. In the case a spin valve sensor is used, it is necessary to cause the electric current to flow in the direction parallel to the elongating direction of the ferromagnetic layer 15, and thus, it is necessary to modify the arrangement of the word line pattern 22 and the bit line pattern 26 in the memory cell block 30.

Further, the MRAM cell 27 may include an active device such as a diode or an MIM (metal-insulator-metal) device between the word line pattern 22 and the TMR sensor. Thereby, the MRAM becomes an active-matrix type MRAM. In the case a diode is provided for this purpose, a p-type polysilicon layer and an n-type polysilicon layer may be provided on the WSi layer 14, and form the ferromagnetic free layer 15 on another WSi layer provided on the n-type polysilicon layer thus formed.

Further, the present invention is not limited to the embodiments described heretofore but various variations and modifications may be made without departing from the scope of the invention.

What is claimed is:

1. A magnetic random access memory, comprising:
   a word line extending in a first direction;
   a bit line extending in a second, different direction; and
   a tunneling magneto-resistive sensor provided between said word line and said bit line in a part where said word line and said bit line cross with each other, said tunneling magneto-resistive sensor comprising:
   a first ferromagnetic layer having a fixed magnetization;
   a second ferromagnetic layer having a variable magnetization; and a tunneling insulation film interposed between said first ferromagnetic layer and said second ferromagnetic layer,
   wherein said first ferromagnetic layer comprising a ferromagnetic material having a spin polarization of 0.9 or higher, and
   wherein said second ferromagnetic layer has a spin polarization of about 0.5 or less.

2. A magnetic random access memory as claimed in claim 1, wherein said first ferromagnetic layer has a spin polarization of about 1.0.

3. A magnetic random access memory as claimed in claim 1, wherein said first ferromagnetic layer comprises a ferromagnetic material selected from the group consisting of $Fe_3O_4$, NiMnSb, PtMnSb, $CrO_2$ and $(La,Sr)MnO_3$.

4. A ferromagnetic random access memory as claimed in claim 1, wherein said second ferromagnetic layer has a spin polarization of about 0.4 or less.

5. A ferromagnetic random access memory as claimed in claim 1, wherein said second ferromagnetic layer has a spin polarization of about 0.2 or less.

6. A magnetic random access memory, comprising:
a word line extending in a first direction;
a bit line extending in a second, different direction;
a magneto-resistive sensor provided between said word line and said bit line in a part where said word line and said bit line cross with each other, said magneto-resistive sensor comprising a ferromagnetic memory layer storing therein information in the form of magnetization; and
a magnetic source applying an offset magnetic field to said ferromagnetic memory layer of said magneto-resistive sensor in the direction of a hard axis of magnetization of said ferromagnetic memory layer.

7. A magnetic random access memory as claimed in claim 6, wherein said magnetic source applies said offset magnetic field so as to satisfy a relationship $$(\delta H_x/H_{x0})^{2/3}+((\delta H_y+H_{yOffset})/H_{y0})^{2/3}<1,$$

where $H_{yOffset}$ represents said offset magnetic field in the direction of said hard axis of magnetization of said ferromagnetic memory layer, $\delta H_x$ and $\delta H_y$ represent magnetic field components induced by a word line current in said word line and a bit line current in said bit line, respectively in the direction of an easy axis of magnetization of said ferromagnetic memory layer and in the direction of said hard axis of magnetization of said ferromagnetic memory layer, $H_{x0}$ and $H_{y0}$ represent a coercive force of said ferromagnetic memory layer respectively in the direction of said easy axis of magnetization and in the direction of said hard axis of magnetization.

8. A magnetic random access memory as claimed in claim 7, wherein said offset magnetic field $H_{yOffset}$ further satisfies the relationship:

$$|\delta H_x| < |H_{x0}|$$

$$|H_{yOffset}| < |H_{y0}|$$

-continued $$|\delta H_y + H_{yOffset}| < |H_{y0}|$$

$$(\delta H_x/H_{x0})^{2/3} + (H_{yOffset}/H_{y0})^{2/3} < 1.$$

9. A magnetic random access memory as claimed in claim 6, wherein said magnetic source comprises a pair of permanent magnets disposed so as to oppose with each other across said magneto-resistive sensor.

10. A magnetic random access memory as claimed in claim 6, wherein said magnetic source comprises a pair of solenoids disposed so as to oppose with each other across said magneto-resistive sensor.

11. A magnetic random access memory as claimed in claim 6, wherein said magneto-resistive sensor comprises a first ferromagnetic layer having a fixed magnetization, a second ferromagnetic layer having a variable magnetization, and a tunneling insulation film interposed between said first ferromagnetic layer and said second ferromagnetic layer, said second ferromagnetic layer being used as said ferromagnetic memory layer.

12. A magnetic random access memory as claimed in claim 6, wherein said magneto-resistive sensor form, together with further magneto-resistive sensors each having a construction identical with a construction of said magneto-resistive sensor, to form a memory cell array, and wherein said magnetic source comprises a pair of permanent magnets disposed at both lateral sides of said memory cell array.

13. A magnetic random access memory as claimed in claim 6, wherein said magneto-resistive sensor form, together with further magneto-resistive sensors each having a construction identical with a construction of said magneto-resistive sensor, to form a memory cell array, and wherein said magnetic source comprises a pair of solenoids disposed at both lateral sides of said memory cell array.

14. A magnetic random access memory as claimed in claim 6, wherein said magneto-resistive sensor form, together with further magneto-resistive sensors each having a construction identical with a construction of said magneto-resistive sensor, to form a plurality of memory blocks, and wherein said magnetic source comprises a pair of permanent magnets disposed at both lateral sides of each of said memory blocks.

15. A magnetic random access memory as claimed in claim 6, wherein said magnetic source produces said offset magnetic field with a magnitude of about 40 Oe.

* * * * *